United States Patent [19]
De Los Santos

[11] Patent Number: 5,945,934
[45] Date of Patent: Aug. 31, 1999

[54] TRACKING ANALOG-TO-DIGITAL CONVERTER

[76] Inventor: Hector J. De Los Santos, 5228 W. 119th St., Inglewood, Calif. 90304

[21] Appl. No.: 08/880,283

[22] Filed: Jun. 23, 1997

[51] Int. Cl.[6] .................................................. H03M 1/62
[52] U.S. Cl. ......................... 341/139; 341/143; 341/120; 341/155; 341/164
[58] Field of Search .................................... 341/143, 120, 341/139, 155, 164

[56] References Cited

U.S. PATENT DOCUMENTS 3,937,066  2/1976  Green et al. ............................... 73/607

OTHER PUBLICATIONS

Michael J. Demler, *High-Speed Analog-to-Digital Conversion*, Academic Press, Inc., 1991, pp. 1–21.
*High-Speed Semiconductor Devices*, S.M. Sze, editor, John Wiley & Sons, Inc., 1990, pp. 528–540.
*Analog-Digital Conversion Handbook*, Daniel H. Sheingold editor, P T R Prentice Hall, 1986, pp. 420–426.

*Primary Examiner*—Brian Young
*Attorney, Agent, or Firm*—Terje Gudmestad; Georgann Grunebach; Michael W. Sales

[57] ABSTRACT

A tracking analog-to-digital converter (ADC) which incorporates an input device, such as a superlattice, which produces a pulsating output current corresponding to the voltage level of an analog input voltage and an encoding device to provides a unique digital code which can be read to yield an approximation of the analog input voltage level. By simultaneously tracking the analog input voltage, the device operates at higher speeds than previously attainable. The resolution of the new ADC is increased by composing the input device to respond to narrow voltage ranges. When the input device is a superlattice, narrow response ranges are accomplished by composing the superlattice to have an increased number of resonances or by vertically stacking a plurality of superlattices.

20 Claims, 3 Drawing Sheets

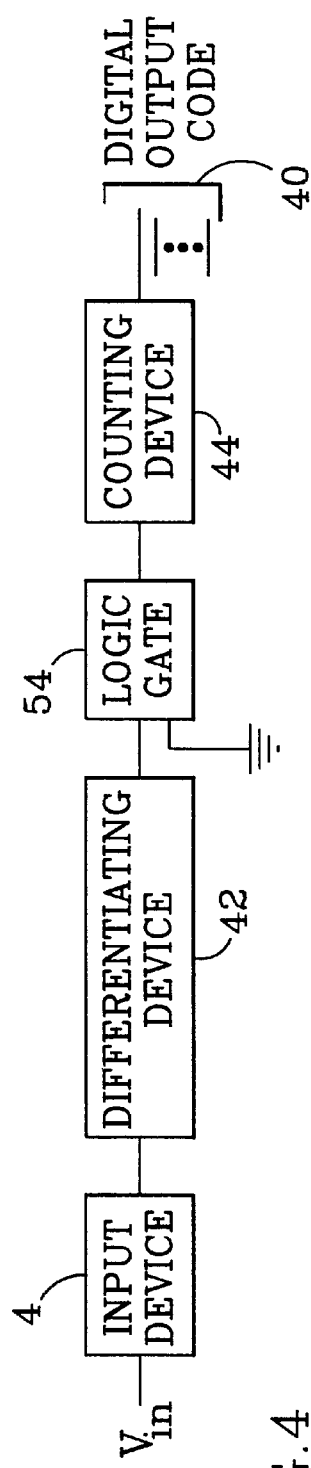
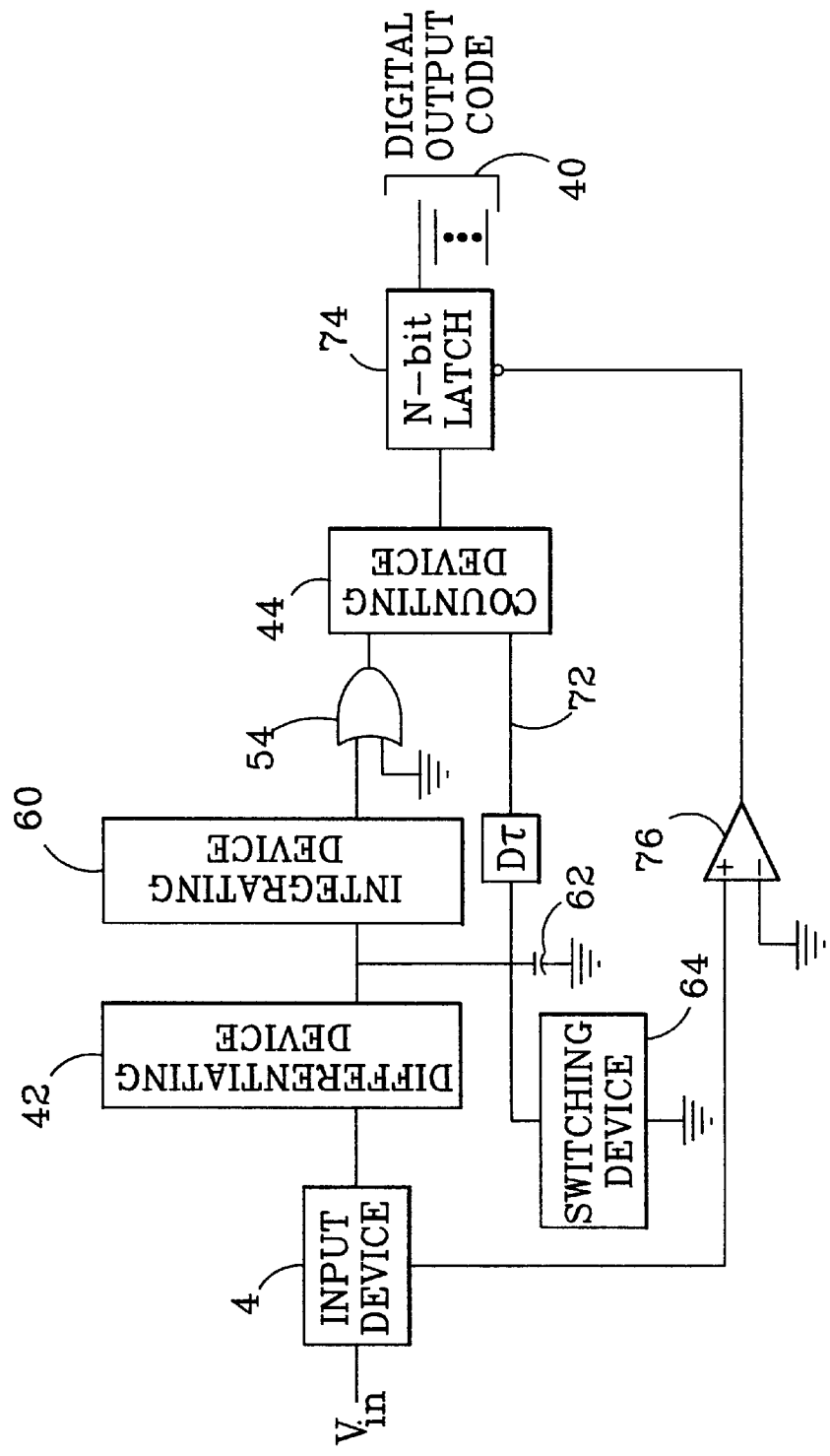

TRACKING ANALOG-TO-DIGITAL CONVERTER

BACKGROUND OF THE INVENTION

1. Field of the Invention

This invention relates to electrical analog-to-digital converters, and more particularly to a tracking analog-to-digital converter.

2. Description of the Related Art

Analog-to-digital converters (ADCs) are used to translate analog input voltages to digital values which can be used by digital computers. The translation is accomplished by quantizing the analog input voltage and converting the quantization level to a digital code.

Numerous different monolithic ADC architectures are available, such as serial, parallel and subranging. The parallel ADC architecture, commonly referred to as flash converters, provides the fastest currently available approach to quantizing an analog signal. Quantization is effectuated by comparing the analog input voltage to successively higher reference voltage levels. In one type of flash converter a bank of comparators is connected to receive an analog input voltage and predetermined reference voltages. The reference voltage levels are generated using a resistor string which divides the total reference voltage into equally spaced voltage levels of decreasing value to provide different quantization levels within the reference voltage range.

While they are the fastest ADCs at this time, the speed of flash converters is limited by the comparators switching speed, and the resolution is limited by the number of comparators used. When higher speed is required, the process of time interleaving may be used. Time interleaving starts the conversion operation of the second sample before the conversion of the first sample is complete. Although the technique allows for higher operating speed, the resolution is usually lower than for the common flash converters.

The resolution of a flash converter is determined by the number of comparators used. One n-bit resolution digital signal is produced in each conversion cycle. Each additional bit of resolution causes a doubling of the amount of circuitry that is required. The conversion resolution is therefore restricted by the area available for the bank of comparators and string of resistors. Not only do the enormous number of resistors and comparators consume valuable area, it is difficult to produce the low-valued resistors required for flash converters while maintaining the resistor-matching characteristics required for accurate performance. Additional information on parallel ADC architecture can be found in Demler, *High-Speed Analog-to-Digital Conversion,* Academic Press, San Diego, 1991, at pages 16–18.

Another limitation of flash converters results when a continuously changing analog input voltage is to be converted. Flash converters have an inherent capacitance characteristic which affects their ability to operate on high frequency analog signals. The base-emitter junction of the transistor on the analog input side has an input capacitance with a charging path through the reference ladder. The time required to charge the capacitor causes the reference voltage to lag fast changes in the current which dynamically distorts the voltage division of the reference ladder.

A track-and-hold (T/H) used with a flash converter overcomes this limitation by holding an analog value so that the comparators are always converting a steady value rather than one which is continuously changing. However, by holding the analog voltage constant, the flash converter is not simultaneously quantizing changes in the analog input voltage. The analog input capacitance of comparators and its effect on flash converts is explained in greater detail in Analog Devices, Inc., *Analog-Digital Conversion Handbook,* P R T Prentic Hall, New Jersey, 1986, pages 423–426.

Serial ADCs offer higher resolution, but, the total conversion time is greatly increased. An example of a serial ADC is the integrating ADC. Integrating ADC's are used in low-speed applications where high accuracy is of primary importance, and are described in Demler, *High-Speed Analog-to-Digital Conversion,* supra, pages 2–4.

One of the reasons for the high degree of accuracy is that the digital output is directly proportional to the voltage level of the analog input voltage. However, the speed of the integrating ADC is limited by the number of bits of the digital output code. Increasing the resolution by one bit requires double the number of clock cycles. Because of the speed limitations, the integrating ADC is not suitable for converting fast changing analog input voltages.

SUMMARY OF THE INVENTION

The tracking converter of the present invention incorporates an input device which produces a pulsating current corresponding to the ADC's analog input voltage. The pulsating output is encoded to provide a unique digital code which can be read to yield an approximation of the analog input voltage level.

An advantage of the tracking converter of this invention is that it operates at higher frequency rates. By tracking the voltage level of the analog input voltage, the tracking ADC overcomes the accuracy limitation of flash converters and the speed limitations of serial ADCs. As a result, it is capable of converting high frequency analog input voltages more accurately.

The accuracy of the digital output is improved by increasing the resolution of the ADC. In an embodiment of the invention, the input device is a superlattice having a plurality of resonances. The number of resonances in the superlattice determines the resolution of the tracking converter. Superlattices can be vertically stacked to increase the resolution of the tracking converter without taking up valuable "chip real estate".

In another embodiment of the invention, a plurality of resonant-tunneling diodes produce the pulsating current. Increasing the number of resonant-tunneling diodes increases the resolution of the tracking ADC.

These and further features and advantages of the invention will be apparent to those skilled in the art from the following detailed description, taken together with the accompanying drawings.

BRIEF DESCRIPTION OF THE DRAWINGS

FIG. 2b is a graph of the resultant pulsating current when the analog input voltage is applied to an input device having the current-voltage characteristics as shown in FIG. 2a;

FIG. 4 is a block diagram of an embodiment of the invention; and

FIG. 5 is a topology diagram of another embodiment of the invention.

DETAILED DESCRIPTION OF THE INVENTION

Figure 1:
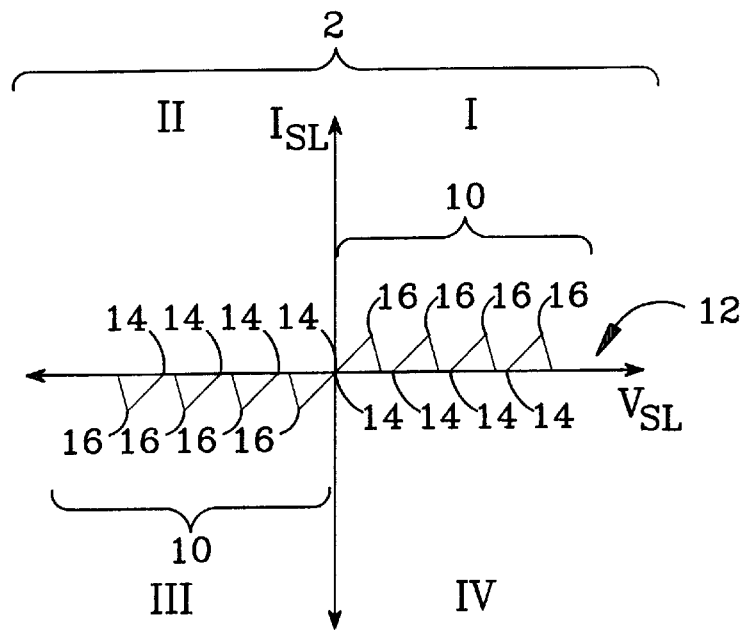
FIG. 1 is a diagram of the current-voltage characteristics of a common superlattice as an input device in an embodiment of the invention.

FIG. 1 illustrates the current-voltage (I–V) characteristic 2 of an input device. For illustration, the invention is described using a superlattice as the input device although other devices, such as resonant-tunneling diodes, may be substituted.

A brief description of a superlattice will aid in understanding the invention as described. Generally, superlattices have a plurality of resonances, referred to as minibands. Each miniband of a superlattice is similar to that of a metal-insulator-metal barrier of a tunnel diode or capacitor. When a voltage is applied, carriers can tunnel from the first miniband to the second miniband until the input voltage exceeds the width of the first miniband. Semiconductor superlattices have been incorporated in high speed tunnel diodes, referred to as superlattice tunnel diodes. This type of diode is described in Sze, *High Speed Semiconductor Devices*, John Wiley & Sons, Inc., New York, 1990, pages 528–530.

As shown in FIG. 1, each miniband 10 along the voltage axis 12 has a bandwidth with a lower and upper threshold voltage, 14 and 16, respectively. When the voltage level applied to the device exceeds the lower threshold 14 of a miniband 10, that miniband 10 conducts until the upper threshold 16 is exceeded.

Figure 2A:
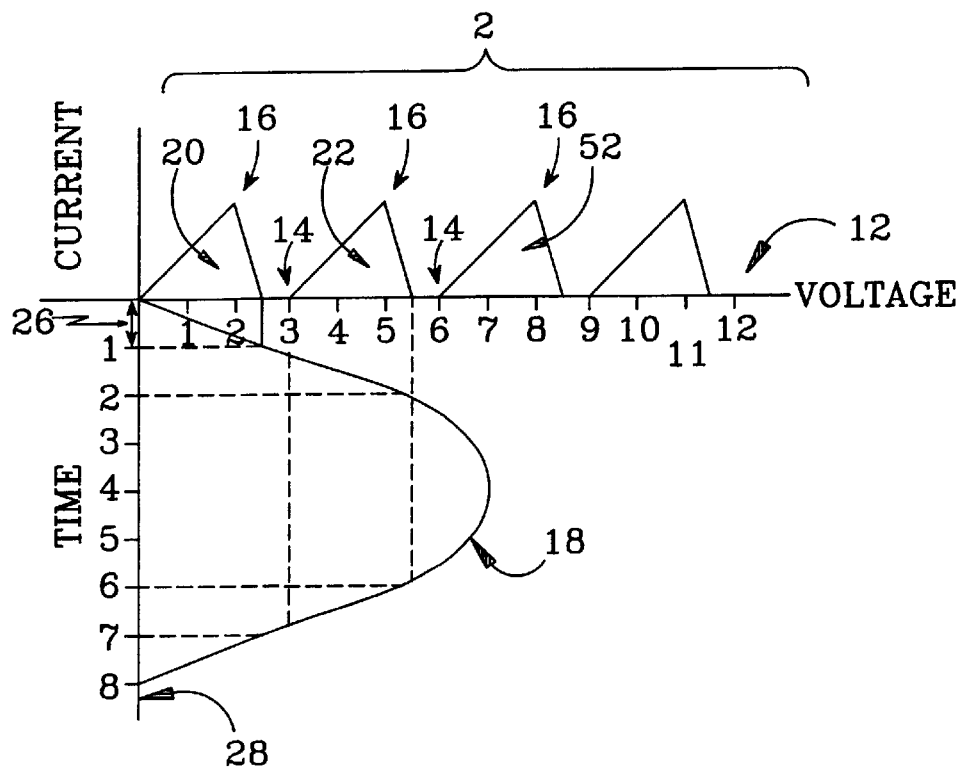
FIG. 2a is a graph showing the relationship between the current-voltage characteristic of the input device and an analog input voltage applied to the device for purpose of illustration.

FIG. 2a illustrates the relationship between an analog input voltage 18 and the I–V characteristic 2 of the superlattice. The horizontal voltage axis 12 is common for both while the two vertical axis are different. The superlattice current is graphed with respect to voltage while the analog input voltage is graphed with respect to time. The two graphs are illustrated together to simplify the explanation of the operation of the invention. The functionality of the invention is described with operation in the first quadrant of the superlattice I–V characteristic 2 plane. When the analog input voltage 18 is negative, the superlattice operates in a converse manner following the I–V characteristics 2 in the third quadrant as shown in FIG. 1.

Figure 2B:
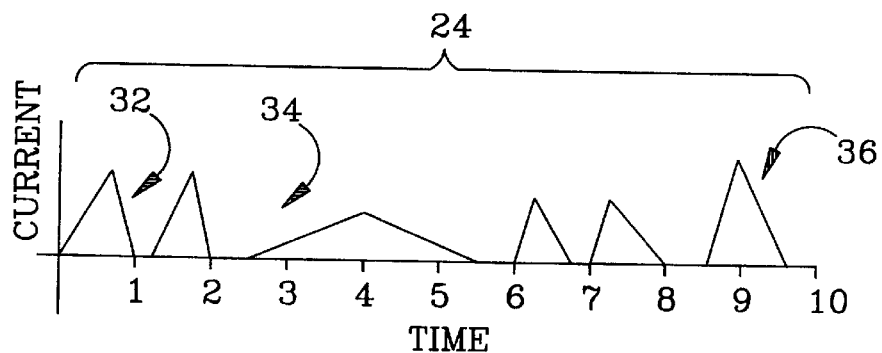

The operation of the invention is demonstrated for the positive cycle of a sinusoidal input voltage. As shown in FIG. 2a, the analog input voltage 18 covers the voltage range zero through seven on the voltage axis 12 of the I–V characteristic 2 of the superlattice. In this example, the lower threshold 14 of the first miniband 20 is minimal and the upper threshold 16 is two volts. The lower threshold 14 of the second miniband 22 is three volts and the upper threshold 16 is five volts. And likewise for the lower and upper thresholds of each successive miniband. FIG. 2b is a graph of the pulsating output current 24, with respect to time, which is generated when the analog input voltage 18 is applied to the superlattice.

As shown by the dashed lines in FIG. 2a, analog input voltage 18 exceeds the first minibands 20 lower threshold 14 during most of the first time period 26 and exceeds the second minibands 22 lower threshold 14 during the second time period. The slope of the pulsating output current 24 pulse is dependant on the change in analog input voltage 18 with respect to time. As shown in FIG. 2b, the slope of the current pulse increases during the time period between the lower threshold 14 and the upper threshold 16 being exceeded as shown in pulses 32 and 34. At the point where the analog input voltage 18 exceeds the upper threshold 16, the current pulses 32 and 34 in FIG. 2b are shown decreasing.

During time periods four through eight on the time in FIG. 2a, the analog input voltage 18 is a decreasing positive value. The resulting current output pulse 36, shown in FIG. 2b, increases sharply until the upper threshold 16 is no longer exceeded and decreases until the lower threshold 14 is no longer exceeded.

Figure 3:
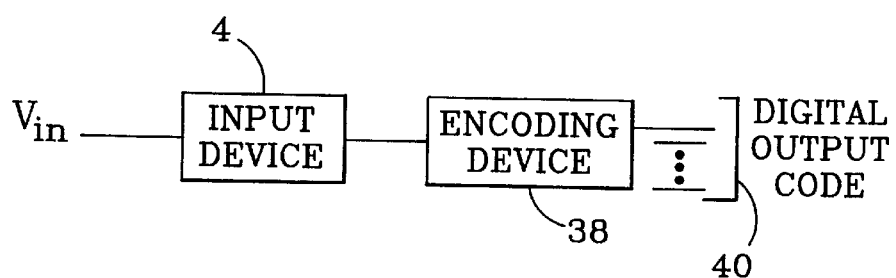
FIG. 3 is a block diagram of the new tracking ADC converter.

As shown in the block diagram of FIG. 3, the input device 4, a superlattice in this example, is connected to encoding device 38 which produces a digital output code 40 corresponding to the voltage level of the analog input voltage 18 applied. The encoding logic 38 may take many forms. In an embodiment of the invention shown in FIG. 4, differentiating device 42 differentiates the pulsating output current 24 to control the count of counting device 44.

Figure 2C:
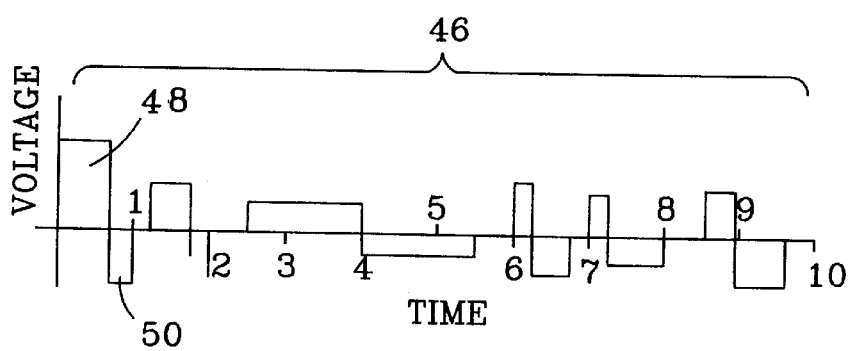
FIG. 2c is a graph of the waveform produced by differentiating the pulsating output shown in FIG. 2b.
Figure 2D:
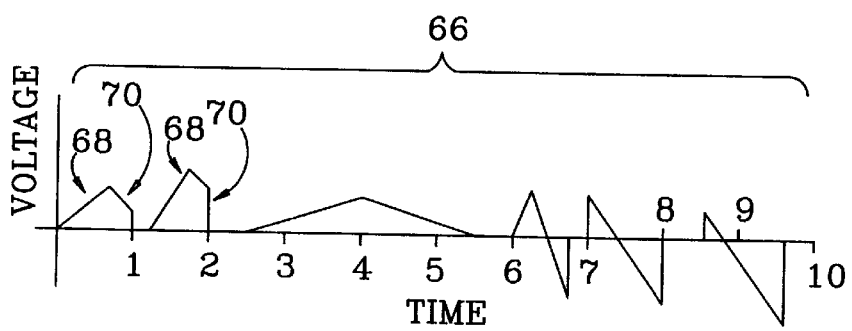
FIG. 2d is a graph of the integrated voltage waveform resulting from summation of each period of the differentiated waveform of FIG. 2c.

Differentiation of the pulsating output current 24 results in the differentiated voltage 46 shown in FIG. 2c, having alternating positive and negative portions 48 and 50, respectively. FIGS. 2b–2d are illustrated together to show the relationship between the waveforms. The differentiated voltage 46 is positive when the pulsating current 24 amplitude is increasing, and negative when it is decreasing. As can be seen in this illustration, the sum of the area of the positive portion 48 and negative portion 50, for the first period is positive since the voltage level of the analog input voltage 18 exceeds the upper threshold 16 of the first miniband 20. However, the analog input voltage 18 does not exceed the upper threshold 16 of the third miniband 52, resulting in a total area for that period equal to zero. Similarly, as the positive analog input voltage 18 decreases, the total area of the differentiated voltage 46 for the corresponding period is negative.

Logic gate 54 shown in FIG. 4, following the differentiating device 42 can be used to provide a logic signal to control the direction counting device 44 counts. For example, the counter may count up when the differentiated voltage 46 is positive, shown by area 48 in FIG. 2b, and count down when it is negative. The resulting digital output code 40 provides a unique digital value corresponding to an approximate measurement of analog input voltage 18.

By allowing counting device 44 to continuously count up or down as succeeding current pulses are generated, the digital output code 40 tracks changes in the voltage level of analog input voltage 18. Utilizing this configuration, the tracking ADC provides a continuous approximation of the analog input voltage 18.

In another embodiment of the invention, shown in FIG. 5, an integrating device 60 sums the area of each period of differentiated voltage 46. Integrating device 60 in this example includes an integrating capacitor 62 and a switching device 64 for discharging the integrating capacitor 62. FIG. 2d is a graph of the integrated voltage 66 resulting from integration of differentiated voltage 46. As shown by the voltage ramp 68 in FIG. 2d, the charge on the integrating capacitor 62 increases to a level which is directly proportional to the voltage level of the positive portion 48 of the differentiated voltage 46. During the negative portion 50 of the period, the charge on the integrating capacitor 62 decreases as shown by the decreasing voltage ramp 70. Following the integration of a period, the polarity of the charge on the capacitor indicates a positive or negative area for that period. As shown by the graph in FIG. 2d, at the end of the first and second periods, the charge on integrating capacitor 62 is positive. The charge is zero at the end of the third period and negative following summation of the forth period. A switching device 64 which monitors differentiated voltage 46 will provide a discharge path for integrating capacitor 62 following each period.

As previously described, a logic gate 54 following integrating device 60 may be used to control the direction which counting device 44 counts. Counting device 44 will count up or down one count following each period of differentiated voltage 46. A trigger 72 derived from a delayed differentiated voltage 46 can be used to trigger the counting device 44 at the end of each period. For example, counting device 44 may be connected to count up when the charge on the integrating capacitor 62 is positive and down when the charge is negative.

The count at the counting device 44 output is then passed on to an output latch 74. Comparator 76 compares the analog input voltage 18 to a known reference voltage, a ground reference in this example, to produce a digital one when the analog input voltage 18 is positive, and a zero when negative. The output of comparator 76 instructs the latch 74 to display a true count when the analog input voltage 18 is positive and the two's complement of the count when the analog input voltage 18 is negative to provide a discrete digital output code 40 corresponding to the voltage level of analog input voltage 18.

Every trigger pulse 72 counting device 44 produces a digital output code 40 which corresponds to the voltage level of the analog input voltage 18. Tracking changes in the analog input voltage 18 allows the new ADC described in this invention to overcome the speed limitations of known parallel and serial converters.

Composing superlattice to have an increased number of resonances improves the resolution of the tracking ADC. Another method of increasing the resolution is level shifting. By shifting the voltage response threshold of successive superlattices to respond to correspondingly higher analog input voltage levels, higher resolution is accomplished. Additional information on the composition and performance of superlattice semiconductors can be found in Fink and Christian, Semiconductor Materials, *Electronics Engineers' Handbook,* Third Edition, McGraw-Hill Book Company, New York, 1989, pages 6–82 through 6–90.

The following is a description of how superlattice stacking and level shifting can improve the resolution of the tracking ADC without significantly increasing the time required for conversion. In the example three superlattices, each having four minibands, are stacked.

The first superlattice may be composed to respond to voltage levels from zero to two volts. The threshold of the second superlattice may be shifted to respond to voltage levels between two and four volts. A third superlattice may be shifted to respond to voltages between four and six volts. By stacking the superlattices described in this example, twelve minibands, having closer threshold levels, are available to respond to voltage changes between zero and six volts. As the threshold levels of each successive miniband is narrowed, it may become necessary to scale the analog input voltage. In other words, to take full advantage of the sensitivity of each successive miniband, it may be necessary to reduce the amplitude of the analog input voltage.

Alternative embodiments will occur to those skilled in the art. Although the tracking ADC was described with a superlattice input device, other devices, such as a plurality of resonance tunneling diodes, could be used to emulate the superlattice structure. Similarly, although embodiments were illustrated using a differentiating device, integrating device, and counting devices, alternative encoding devices could be used. Such variations and alternatives are contemplated, and can be made without departing from the spirit and scope of the invention as defined in the appended claims.

I claim:

1. A tracking analog-to-digital converter (ADC) for converting an analog input voltage to a digital output codes, comprising:

a carrier-tunneling input device having a plurality of tunneling resonances and a current-voltage characteristic which produces a pulsating output current corresponding to said analog input voltage, and an encoding device which responds to said pulsating output current by producing said digital output code corresponding to an approximate measurement of said analog input voltage.

2. A tracking analog-to-digital converter (ADC) for converting an analog input voltage to a digital output code, comprising:

an input device having a current-voltage characteristic which produces a pulsating output current corresponding to said analog input voltage, wherein said input device is a plurality of resonant tunneling diodes each responding to a successively higher level of said analog input voltage, said plurality of resonant tunneling diodes producing said pulsating output current corresponding to the number of said plurality of resonant tunneling diodes which conduct, and an encoding device which responds to said pulsating output current by producing said digital output code corresponding to an approximate measurement of said analog input voltage.

3. A tracking analog-to-digital converter (ADC) for converting an analog input voltage to a digital output code, comprising:

an input device having a current-voltage characteristic which produces a pulsating output current corresponding to said analog input voltage, wherein said input device is a superlattice having a plurality of minibands which conduct in response to said analog input voltage exceeding respective threshold levels for said plurality of minibands, said superlattice producing said pulsating output current corresponding to the number of said plurality of minibands which conduct, and an encoding device which responds to said pulsating output current by producing said digital output code corresponding to an approximate measurement of said analog input voltage.

4. The converter of claim 3, wherein a plurality of superlattices are stacked to increase the resolution of the converter.

5. The converter of claim 4, wherein the voltage response threshold of successive said plurality of superlattices is shifted to respond to correspondingly higher voltage levels of said analog input voltage to increase resolution.

6. A tracking analog-to-digital converter (ADC) for converting an analog input voltage to a digital output code comprising:

an input device having a current-voltage characteristic which produces a pulsating output current corresponding to said analog input voltage, a differentiating device connected to said input device to produce a differentiated voltage having an alternating polarity, a logic device to change said differentiated voltage to a corresponding logic signal, and a counting device which receives said logic signal to produce said digital output code.

7. The converter of claim 6, wherein said input device is a plurality of resonant tunneling diodes each responding to a successively higher level of said analog input voltage, said plurality of resonant tunneling diodes producing said pulsating output current corresponding to the number of said plurality of resonant tunneling diodes which conduct.

8. The converter of claim 6, wherein said input device is a superlattice having a plurality of minibands which conduct in response to said analog input voltage exceeding respective threshold levels for said plurality of minibands, said superlattice producing said pulsating output current corresponding to the number of said plurality of minibands which conduct.

9. The converter of claim 8, wherein a plurality of superlattices are stacked to increase the resolution of the converter.

10. The converter of claim 9, wherein the voltage response threshold of successive said plurality of superlattices is shifted to respond to correspondingly higher voltage levels of said analog input voltage to increase resolution.

11. A tracking analog-to-digital converter (ADC) for converting an analog input voltage to a digital output code comprising:

an input device having a current-voltage characteristic which produces a pulsating output current corresponding to said analog input voltage, a differentiating device connected to said input device to produce a differentiated voltage having an alternating polarity, an integrating device to sum each period of said differentiated voltage and producing an integrated voltage of opposite polarity for positive and negative summations, a logic device to change said integrated voltage to a corresponding logic signal, and an encoding device for converting said integrated voltage into said digital output code which corresponds to an approximate measurement of said analog input voltage.

12. The converter of claim 11, wherein said integrating device includes:

an integrating capacitor which charges to a voltage level approximately corresponding to the voltage level of a period of said differentiated voltage, and a switching device to provide a discharge path for said integrating capacitor following each period.

13. The converter of claim 11 wherein said encoding device is a counting device which receives said logic signal to produce said digital output code.

14. The converter of claim 11, wherein said input device is a plurality of resonant tunneling diodes each responding to a successively higher level of said analog input voltage, said plurality of resonant tunneling diodes producing said pulsating output current corresponding to the number of said plurality of resonant tunneling diodes which conduct.

15. The converter of claim 11, wherein said input device is a superlattice having a plurality of minibands to produce said pulsating output current which reflects the number of said plurality of minibands which conduct for said analog input voltage which is applied to said superlattice.

16. The converter of claim 15, wherein a plurality of superlattices are stacked to increase the resolution of the converter.

17. The converter of claim 16, wherein the voltage response threshold of successive said plurality of superlattices is shifted to respond to correspondingly higher voltage levels of said analog input voltage to improving resolution.

18. The converter of claim 1, wherein said carrier-tunneling input device is a plurality of resonant-tunneling diodes.

19. The converter of claim 1, wherein said carrier-tunneling input device is a semiconductor superlattice that has a plurality of minibands.

20. The converter of claim 1, wherein said encoding device includes:

a differentiating device connected to said input device to produce a differentiated voltage having an alternating polarity, and a counting device whose count direction is responsive to said polarity and thereby produces said digital output code.

* * * * *